United States Patent [19]
Liao et al.

[11] Patent Number: 6,017,828
[45] Date of Patent: Jan. 25, 2000

[54] METHOD FOR PREVENTING BACKSIDE POLYSILICON PEELING IN A 4T+2R SRAM PROCESS

[75] Inventors: Hung-Che Liao, Changhua Hsien; Hsien-Wei Chin, Hsinchu; Chih-Ming Chen, Taoyuan Hsien, all of Taiwan

[73] Assignee: Taiwan Semiconductor Manufacturing Co., Ltd., Hsinchu, Taiwan

[21] Appl. No.: 08/861,172

[22] Filed: May 21, 1997

[51] Int. Cl.[7] .................................................. H01L 21/322
[52] U.S. Cl. ...................... 438/778; 438/778; 438/238; 438/384; 438/385; 438/928; 438/488; 257/903; 257/904
[58] Field of Search .................................. 257/903, 904; 438/238, 778, 384, 385, 928, 488

[56] References Cited

U.S. PATENT DOCUMENTS

| | | | |
|---|---|---|---|
| 5,094,714 | 3/1992 | Nishimura et al. | 428/428 |
| 5,296,385 | 3/1994 | Moslehi et al. | 438/514 |
| 5,578,854 | 11/1996 | Chen et al. | 257/903 |
| 5,605,602 | 2/1997 | Debusk | 438/565 |
| 5,622,899 | 4/1997 | Chao et al. | 438/9 |
| 5,644,151 | 7/1997 | Izumi et al. | 257/306 |
| 5,656,510 | 8/1997 | Chrapacz et al. | 438/394 |
| 5,696,386 | 12/1997 | Yamazaki | 257/57 |
| 5,789,308 | 8/1998 | Debusk | 438/476 |
| 5,801,104 | 9/1998 | Schuegraf et al. | 438/778 |

OTHER PUBLICATIONS

Stanley Wolf, Silcion processing for the VLSI Era, vol. 1, pp. 175, 170, 1990.

*Primary Examiner*—Charles Bowers
*Assistant Examiner*—Thanh Nguyen
*Attorney, Agent, or Firm*—Christensen O'Connor Johnson & Kindness PLLC

[57] ABSTRACT

The present invention is a method for preventing backside polysilicon peeling in 4T+2R SRAM process. This invention utilizes forming oxide cap layer on the backside of the wafer to protect the backside polysilicon. Thus, the backside polysilicon is free from peeling and damage.

8 Claims, 3 Drawing Sheets

METHOD FOR PREVENTING BACKSIDE POLYSILICON PEELING IN A 4T+2R SRAM PROCESS

FIELD OF THE INVENTION

The present invention relates to methods for manufacturing semiconductor integrated circuits and, more particularly, to methods for manufacturing static random access memories (SRAMs) with memory cells each having four transistors and two resistors (4T+2R). Still more particularly, the present invention relates to methods for preventing backside polysilicon peeling in 4T+2R SRAM processes.

BACKGROUND OF THE INVENTION

In a typical conventional 4T+2R SRAM process, the two resistors in each SRAM cell are implemented using polysilicon resistors. Because the resistors are used as the load devices for the SRAM cell, the polysilicon resistors are implemented to have a high resistance value, thereby decreasing power dissipation. In a typical process to form the SRAM cell load resistors (commonly referred to as the poly-load process), polysilicon is deposited on both sides of the wafer.

In these conventional SRAM fabrication processes, the polysilicon on the backside of the wafer is susceptible to peeling during subsequent processing of the wafer (i.e., backside polysilicon peeling). Of course, the backside polysilicon peeling is undesirable because the peeled polysilicon is a source of particle contamination in the wafers, cassette and equipment. As is well known, particle contamination generally decreases yields, thereby increasing production costs.

FIG. 1 is a flow chart illustrating a typical SRAM process that is susceptible to backside polysilicon peeling. In a step 10, a poly-load film is formed on a substrate using a standard process. For example, the poly-load film may be formed by using a standard furnace process, which results in the poly-load film being formed on both sides of the wafer.

Then, an interlayer dielectric (ILD) layer is formed on the poly-load film as indicated by the block 12. Generally, the ILD layer is formed by depositing a BPTTEOS layer on the frontside of the wafer using a standard CVD process. However, in practice, a thin native oxide layer is formed on the backside poly-load film as a result of a thermal treatment performed after depositing the poly-load film.

Then a step 14 is performed in which the ILD layer is patterned and etched to form contact holes through the ILD layer so that the load resistors may be electrically connected to the transistors of the SRAM cell. In a typical process, a metal layer is used to interconnect the load resistors. Thus, in a next step 16, a standard pre-metal dip process is performed to clean the contact holes formed in the step 14. Unfortunately, this pre-metal dip also attacks the native oxide layer which was formed on the backside polysilicon. Because this native oxide layer is very thin, portions of the backside polysilicon are exposed after the pre-metal dip.

In a next step 18, a metal layer (metall or M1 layer) is deposited on the ILD layer. The metall layer is then patterned and etched to form the interconnect in a step 20. After the metall layer is etched, the photoresist layer used to pattern the metall layer is stripped. In most standard stripping processes, the wafer is dipped in an acidic etching solution. This acidic solution will then also attack the unprotected poly-load layer on the backside of the wafer, resulting in the backside polysilicon peeling.

SUMMARY OF THE INVENTION

In accordance with the present invention, a method for preventing backside polysilicon peeling in a 4T+2R SPAM process is provided. In one embodiment, the method includes forming a polysilicon layer on both sides of a substrate. An oxide layer is then formed on the backside of the substrate. Then, a dielectric layer is formed on the polysilicon layer to serve as an ILD layer. The oxide layer covers the backside polysilicon layer, thereby protecting the polysilicon during subsequent processing.

In another embodiment, a polysilicon layer is formed on both sides of a substrate. A dielectric layer is formed on the polysilicon layer using in-situ oxidation. Thus, at the same time, an oxide layer is formed on the backside of the substrate. Thus, in both embodiments, an oxide layer covers the backside polysilicon. As a result, the pre-metal dip does not expose the backside polysilicon layer, thereby preventing backside polysilicon peeling during the subsequent photoresist stripping after the metall layer is patterned and etched.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

The methods of preventing backside polysilicon peeling in a 4T+2R SRAM process described herein include process procedures that are well known in the art of semiconductor integrated circuit fabrication and, thus, need not be described in detail. For example, the standard photolithographic patterning and etching processes are very well known and, therefore, the various steps of these process are omitted.

Figure 1:
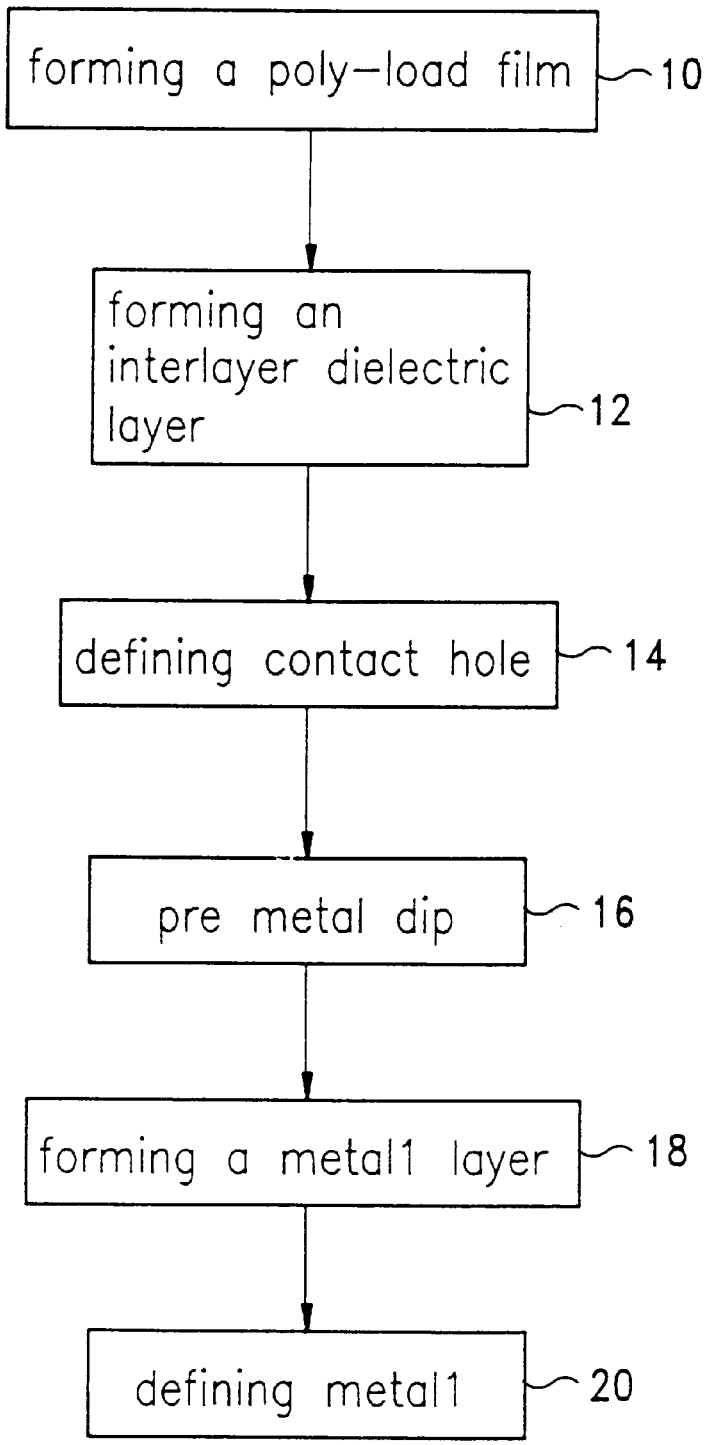
FIG. 1 is a flow chart illustrating a conventional 4T+2R SRAM process.
Figure 2:
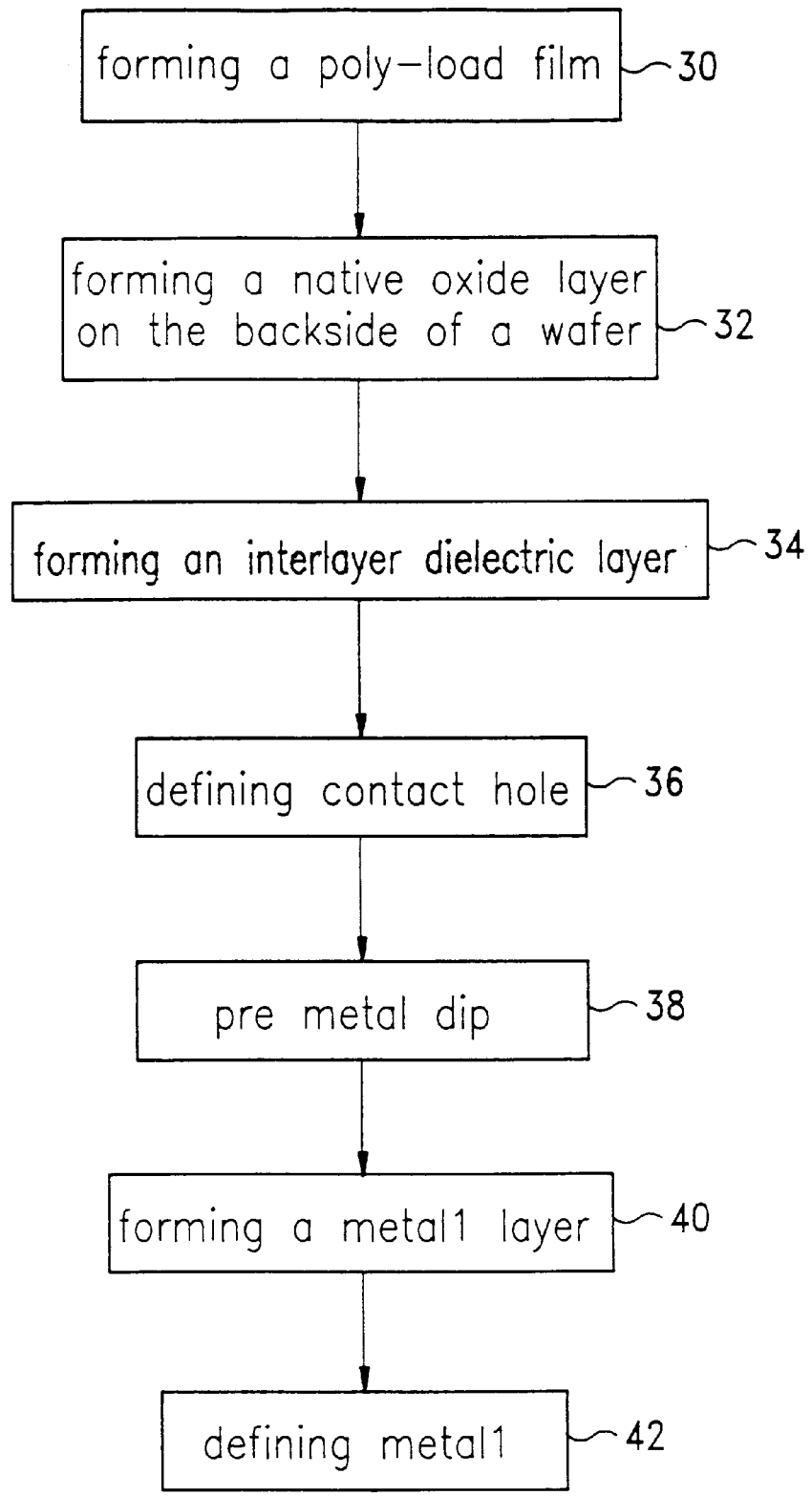
FIG. 2 is a flow chart illustrating a 4T+2R SRAM process according to one embodiment of the present invention.

FIG. 2 is a flow chart illustrating part of a 4T+2R SRAM process with reduced backside polysilicon peeling, in accordance with one embodiment of the present invention. In a step 30, a poly-load film is formed on a semiconductor substrate using a standard furnace process. In this embodiment, the poly-load film is undoped polysilicon and is used to form the load resistors of the SRAM cells. In addition, this furnace process results in the poly-load film also being formed on the backside of the wafer containing the semiconductor substrate. Of course, in other embodiments, the poly-load film can be formed by any suitable process. More specifically, a high resistance poly-load film is formed by a conventional chemical vapor deposition (CVD) and a thermal treatment. In this embodiment, the thickness of the poly-load film is about 500 angstroms.

Then in a step 32, an oxide layer is formed on the backside of the wafer. In this embodiment, the oxide layer is formed by depositing an oxide layer on the backside of the wafer using a low pressure CVD process using TEOS as a source. This oxide layer is formed to a thick of about 1000 angstroms to completely cover the backside poly-load film, thereby protecting the backside poly-load film during subsequent processing.

Then, in a step 34, an ILD layer is deposited on the poly-load film on the frontside of wafer. In this embodiment, the ILD layer is a doped oxide layer, such as BPSG, although any suitable dielectric material may be used. The interlayer dielectric layer is formed by using any suitable method. In this embodiment, the interlayer dielectric layer has the thickness of a range of about 5000 to 8000 angstroms.

In a next step 36, contact holes are then defined in the ILD layer. In this embodiment, opening the contact hole is performed by conventional patterning and etching process. A standard pre-metal dip is then performed to clean the contact holes in order to deposit the metal I layer in a next step 38. In this embodiment, the pre-metal dip is a conventional wet etching process using a BOE solution. Of course, the wet etching process can use any suitable acidic solution. Although this pre-metal dip will also remove a portion of the oxide layer formed on the backside of a wafer, the oxide layer is thick enough so that the poly-load film on the backside of the wafer is not exposed.

Then, a metal 1 layer is formed in a next step 40. In this embodiment, the metal 1 layer can be any suitable metal material such as, for example, doped polysilicon or tungsten. The metal 1 layer can be formed by using conventional chemical vapor deposition or sputtering methods. In this embodiment, the metal 1 layer is about 3000 angstroms.

Then in a subsequent step 42, the metal 1 layer is defined to form interconnect. In this embodiment, the step of defining the metal 1 layer is performed by a conventional patterning and etching process. In this step, unlike the conventional method, the acidic solution used in stripping the photoresist does not attack the poly-load layer on the backside of the wafer because the poly-load is protected by the oxide layer. Therefore, the method of this invention does not have the problem of backside polysilicon peeling. The rest of the SRAM fabrication process is conventional, and thus need not be described.

Figure 3:
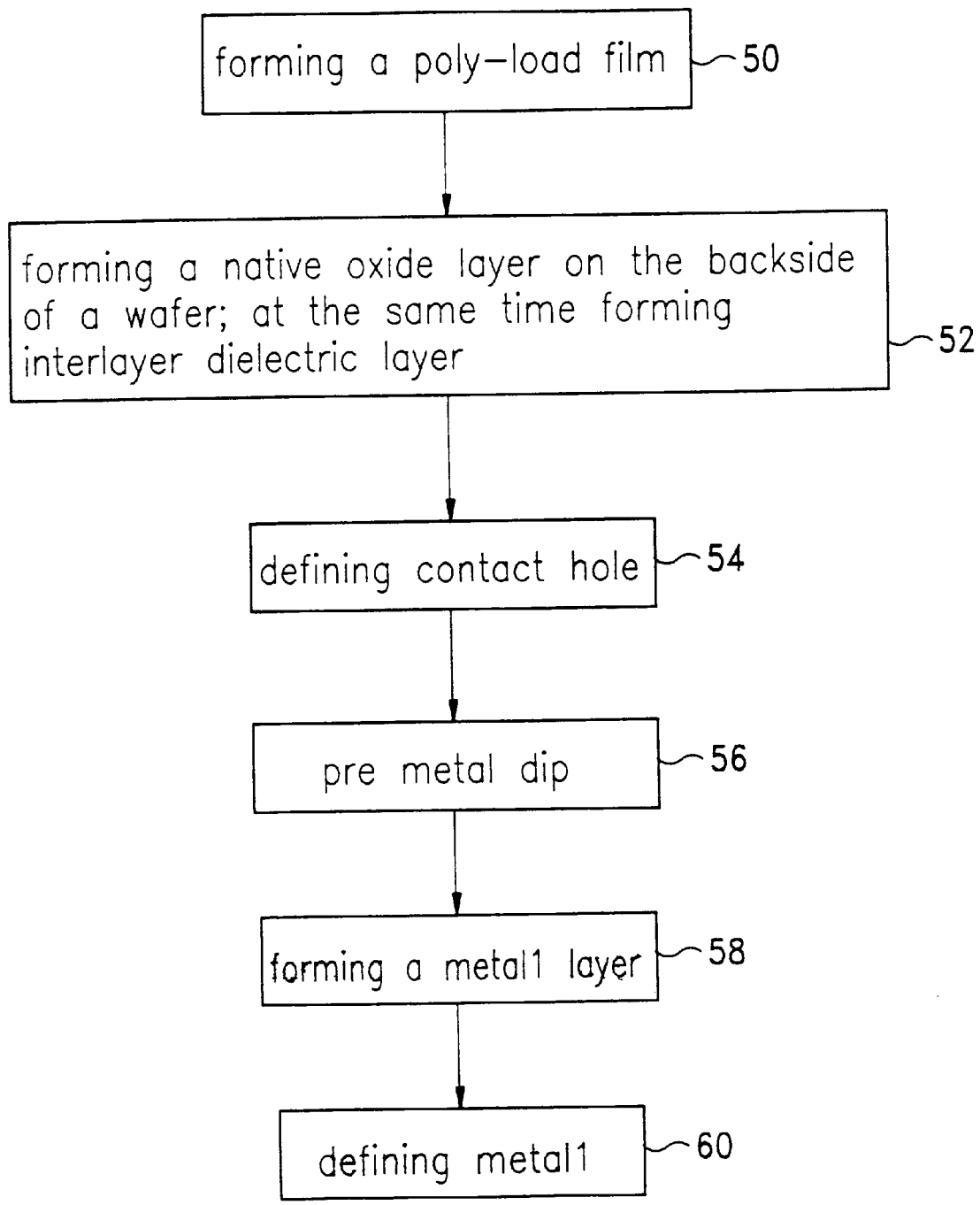
FIG. 3 is a flow chart illustrating a 4T+2R SRAM process according to another embodiment of the present invention.

FIG. 3 is a flow chart of another embodiment of the present invention. In a step 50, a poly-load film is formed on a substrate in a manner similar to the step 30 in FIG. 2. In this embodiment, the poly-load film is an undoped polysilicon deposited using a furnace process. In addition, the furance process causes the poly-load film also to be formed on the backside of the wafer containing the substrate. More specifically, a conventional CVD method and thermal treatment is used to form the poly-load film to a thickness of about 500 angstroms. In practice, a thin native oxide layer is formed on the backside of a wafer because of the thermal treatment. However, this native oxide layer is very thin.

Then in a step 52, an ILD layer is then formed on the poly-load film, similar to the step 34 (FIG. 2). At the same time, an oxide layer is formed on the backside of the wafer. In this embodiment, the ILD layer is formed of BPSG using a chemical vapor deposition process with a BPTEOS as a source. However, unlike a conventional process, an oxygen flow is added to the standard chemical vapor deposition process using a BPTEOS source. The oxygen is then available to oxidize the backside poly-load film during the standard thermal process used to planarize the BPSG layer. As a result, a cap oxide is formed on the backside poly-load film, which serves to protect the backside poly-load film during subsequent processing. In this embodiment, the ILD layer has a thickness ranging from about 6000 to 8000 angstroms. In this embodiment, the cap oxide layer on the backside poly-load film has a thickness of about 100 to 500 angstroms.

In a next step 54, a contact hole is then defined. In this embodiment, opening the contact hole is defined by a conventional patterning and etching process. A pre-metal dip is then performed to clean the contact hole in order to deposit the metal 1 layer in a step 56. In this embodiment, the pre-metal dip is performed using a wet etching process. The wet etching process can use any suitable acidic solution such as, for example, BOE solution. Although this pre-metal dip will attack the cap oxide layer on the backside of a wafer, the poly-load film on the backside of the wafer is not exposed because the cap oxide due to the relatively large thickness of the cap oxide layer.

Then, a metal 1 layer is formed in a next step 58. In this embodiment, the metal 1 layer can be any suitable metal material such as, for example, doped polysilicon or tungsten. The metal 1 layer can be formed by using a conventional chemical vapor deposition method or sputtering method. In this embodiment, the metal I layer is about 3000 angstroms. A subsequent step 60 is then performed to define the metal 1 layer. In this embodiment, the step of defining the metal 1 layer is performed by conventional patterning and etching process. In this step, unlike conventional method, the acidic solution stripping the photoresist does not attack the poly-load film on the backside of the wafer because the backside poly-load film is protected by the cap oxide layer. Therefore, the method of this invention do not have the problem of backside polysilicon peeling. In addition, this embodiment does not add a process step.

Although several embodiments, including the preferred embodiment, have been illustrated and described, it will be obvious to those skilled in the art that various modifications may be made without departing from the spirit and scope of the present invention, which is intended to be limited solely by the appended claims.

The embodiments of the invention in which an exclusive property or privilege is claimed are defined as follows:

1. A method for preventing backside polysilicon layer peeling in the fabrication of a 4T+2R SRAM, said method comprising:

forming said backside polysilicon layer on a substrate;

forming an oxide layer on the backside of said substrate to completely cover said backside polysilicon layer to prevent said backside polysilicon layer from peeling in subsequent processes; and form an interlayer dielectric layer on said backside polysilicon layer.

2. The method according to claim 1, wherein said backside polysilicon layer serves as resistors.

3. The method according to claim 1, wherein said oxide layer comprises a silicon dioxide layer.

4. The method according to claim 1, wherein said interlayer dielectric layer comprises a BPSG layer.

5. The method according to claim 1, wherein said oxide layer has a thickness ranging from about 100 to 500 angstroms.

6. A method for preventing backside polysilicon layer peeling in fabricating a 4T+2R SRAM comprising:

forming said backside polysilicon layer on a substrate;

forming a dielectric layer on said backside polysilicon layer by a chemical vapor deposition process with BPTEOS as a source; and adding oxygen flow to said chemical vapor deposition process to form a cap oxide on said backside polysilicon layer, whereby to prevent said backside polysilicon layer from peeling in subsequent processes.

7. The method of claim 6, wherein said step of forming said dielectric layer and said step of adding oxygen flow are executed simultaneously.

8. The method of claim 6, wherein said backside polysilicon layer serves as resistors.

* * * * *